US012170529B1

(12) United States Patent
Ling et al.

(10) Patent No.: US 12,170,529 B1
(45) Date of Patent: Dec. 17, 2024

(54) ACCELERATING LOW-DENSITY PARITY-CHECK DECODING VIA SCHEDULING, AND RELATED DEVICES, METHODS AND COMPUTER PROGRAMS

(71) Applicant: Nokia Solutions and Networks Oy, Espoo (FI)

(72) Inventors: Jonathan Ling, Murray Hill, NJ (US); Paul Cautereels, Antwerp (BE)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 18/674,278

(22) Filed: May 24, 2024

(30) Foreign Application Priority Data

May 29, 2023 (FI) .................................... 20235596

(51) Int. Cl.
*H03M 13/11* (2006.01)
*H03M 13/39* (2006.01)

(52) U.S. Cl.
CPC .... *H03M 13/1131* (2013.01); *H03M 13/1125* (2013.01); *H03M 13/3961* (2013.01)

(58) Field of Classification Search
CPC ................................................ H03M 13/1131
See application file for complete search history.

(56) References Cited

U.S. PATENT DOCUMENTS

| 8,489,957 | B2 * | 7/2013 | Wesel | H03M 13/116 |
| | | | | 714/752 |
| 8,918,696 | B2 | 12/2014 | Ng et al. | |
| 2009/0100312 | A1 * | 4/2009 | Uchikawa | H03M 13/112 |
| | | | | 714/752 |
| 2018/0226989 | A1 | 8/2018 | Soriaga et al. | |
| 2018/0358984 | A1 * | 12/2018 | Richardson | H03M 13/616 |
| 2021/0075442 | A1 * | 3/2021 | Myung | H03M 13/1102 |
| 2023/0137523 | A1 * | 5/2023 | Babaei | H04L 1/1887 |
| | | | | 370/329 |
| 2023/0170921 | A1 * | 6/2023 | Eun | H03M 13/1131 |
| | | | | 714/746 |
| 2023/0253984 | A1 * | 8/2023 | Jang | H03M 13/1111 |
| | | | | 714/752 |

FOREIGN PATENT DOCUMENTS

WO 2019/191398 A1 10/2019

OTHER PUBLICATIONS

"3rd Generation Partnership Project; Technical Specification Group Radio Access Network; NR; Multiplexing and channel coding (Release 17)", 3GPP TS 38.212, V17.5.0, Mar. 2023, pp. 1-203.
Richardson et al., "Design of Low-Density Parity Check Codes for 5G New Radio", IEEE Communications Magazine, vol. 56, No. 03, Mar. 2018, pp. 28-34.

(Continued)

*Primary Examiner* — Joseph D Torres
(74) *Attorney, Agent, or Firm* — Nokia Technologies Oy

(57) ABSTRACT

Devices, methods and computer programs for accelerating low-density parity-check (LDPC) decoding via scheduling are disclosed. At least some of the example embodiments described herein may allow reducing cost and improving power efficiency beyond that of semiconductor processor scaling currently used in accelerating LDPC decoding.

12 Claims, 5 Drawing Sheets

(56) References Cited

OTHER PUBLICATIONS

Gal et al., "A High Throughput Efficient Approach for Decoding LDPC Codes onto GPU Devices", IEEE Embedded Systems Letters, vol. 06, No. 02, Jun. 2014, pp. 29-32.

Chen et al., "Near Optimum Universal Belief Propagation Based Decoding of Low-Density Parity Check Codes", IEEE Transactions on Communications, vol. 50, No. 03, Mar. 2002, pp. 406-414.

Frenzel et al., "Static Layered Schedules and Core-Only Parity Check for the 5G New Radio LDPC Codes", 12th International ITG Conference on Systems, Communications and Coding, Feb. 11-14, 2019, pp. 280-284.

Casado et al., "Informed Dynamic Scheduling for Belief-Propagation Decoding of LDPC Codes", IEEE International Conference on Communications, Jun. 24-28, 2007, pp. 932-937.

Office action received for corresponding Finnish Patent Application No. 20235596, dated Dec. 21, 2023, 9 pages.

Tian et al., "A Novel Base Graph Based Static Scheduling Scheme for Layered Decoding of 5G LDPC Codes", IEEE Communications Letters, vol. 26, No. 07, Jul. 2022, pp. 1450-1453.

Lee et al., "Multi-Mode QC-LDPC Decoding Architecture With Novel Memory Access Scheduling for 5G New-Radio Standard", IEEE Transactions on Circuits and Systems I: Regular Papers, vol. 69, No. 05, May 2022, pp. 2035-2048.

Ling et al., "Fast LDPC GPU Decoder for Cloud RAN", IEEE Embedded Systems Letters, vol. 13, No. 04, Dec. 2021, pp. 170-173.

Thameur et al., "A Survey on Decoding Schedules of LDPC Convolutional Codes and Associated Hardware Architectures", IEEE Symposium on Computers and Communications (ISCC), Jul. 3-6, 2017, 8 pages.

Office action received for corresponding Finnish Patent Application No. 20235596, dated May 21, 2024, 5 pages.

Extended European Search Report received for corresponding European Patent Application No. 24177677.2, dated Oct. 16, 2024, 11 pages.

* cited by examiner

ACCELERATING LOW-DENSITY PARITY-CHECK DECODING VIA SCHEDULING, AND RELATED DEVICES, METHODS AND COMPUTER PROGRAMS

RELATED APPLICATION

This application claims benefit of priority from Finnish Patent App. No. 20235596, filed May 29, 2023, the disclosure of which is hereby incorporated in its entirety by reference herein.

TECHNICAL FIELD

The disclosure relates generally to communications and, more particularly but not exclusively, to accelerating low-density parity-check decoding via scheduling, as well as related devices, methods and computer programs.

BACKGROUND

Low-density parity-check (LDPC) is used for channel coding of user data in fifth generation (5G) wireless networks. It provides error correction and high spectral efficiency. However, decoding complexity is very high, and decoders are typically accelerated by either fixed or programmable accelerators, such as graphics processing units (GPUs), field-programmable gate arrays (FPGAs), or program-specific integrated circuits (ASICs).

It is expected that sixth generation (6G) wireless networks significantly increase data rates. Accordingly, at least in some situations, there may be a need to find ways to reduce cost and improve power efficiency beyond that of semiconductor processor scaling.

SUMMARY

The scope of protection sought for various example embodiments of the invention is set out by the independent claims. The example embodiments and features, if any, described in this specification that do not fall under the scope of the independent claims are to be interpreted as examples useful for understanding various example embodiments of the invention.

An example embodiment of a radio receiver device comprises at least one processor, and at least one memory storing instructions that, when executed by the at least one processor, cause the radio receiver device at least to perform receiving a radio signal comprising low-density parity-check, LDPC, encoded information bits. The instructions, when executed by the at least one processor, further cause the radio receiver device at least to perform applying LDPC decoding to the received LDPC encoded information bits to recover the information bits. The applying of the LDPC decoding comprises processing an LDPC base graph. The processing of the LDPC base graph comprises scheduling a processing of at least one sequence of rows of the LDPC base graph according to a scheduling state of the at least one sequence of rows, such that transitioning from a current scheduling state of the at least one sequence of rows to a subsequent scheduling state of the at least one sequence of rows occurs according to a state transition metric.

In an example embodiment, alternatively or in addition to the above-described example embodiments, the state transition metric comprises a relationship between a current number of parity check errors and one or more parity check error thresholds, or a relationship between a magnitude of log-likelihood ratios, LLRs, of the information bits and one or more LLR thresholds.

In an example embodiment, alternatively or in addition to the above-described example embodiments, the scheduling states include an extension only, EO, scheduling state in which only an extension check sequence of rows is scheduled. The scheduling states further include an extension and core, EC, scheduling state in which an extension check sequence of rows is scheduled first and a core check sequence of rows is scheduled subsequently. The scheduling states further include an extension and core and core, ECC, scheduling state in which an extension check sequence of rows is scheduled first and a core check sequence of rows is scheduled subsequently twice. The scheduling states further include a core only, CO, scheduling state in which only a core check sequence of rows is scheduled.

In an example embodiment, alternatively or in addition to the above-described example embodiments, the current scheduling state comprises the EO scheduling state and the subsequent scheduling state comprises the EC scheduling state, and the transitioning occurs in response to the current number of the parity check errors falling below a first parity check error threshold.

In an example embodiment, alternatively or in addition to the above-described example embodiments, the current scheduling state comprises the EC scheduling state and the subsequent scheduling state comprises the ECC scheduling state, and the transitioning occurs in response to the current number of the parity check errors exceeding a second parity check error threshold and falling below a third parity check error threshold.

In an example embodiment, alternatively or in addition to the above-described example embodiments, the current scheduling state comprises the EC scheduling state and the subsequent scheduling state comprises the CO scheduling state, and the transitioning occurs in response to the current number of the parity check errors falling below a fourth parity check error threshold.

In an example embodiment, alternatively or in addition to the above-described example embodiments, the current scheduling state comprises the ECC scheduling state and the subsequent scheduling state comprises the CO scheduling state, and the transitioning occurs in response to the current number of the parity check errors falling below a fifth parity check error threshold.

In an example embodiment, alternatively or in addition to the above-described example embodiments, the instructions, when executed by the at least one processor, further cause the radio receiver device to perform utilizing the EO scheduling state as an initial scheduling state.

In an example embodiment, alternatively or in addition to the above-described example embodiments, the instructions, when executed by the at least one processor, further cause the radio receiver device to perform terminating the scheduling of the processing in response to the number of the parity check errors for the core check sequence of rows equaling zero.

In an example embodiment, alternatively or in addition to the above-described example embodiments, the core check sequence of rows comprises first four rows of the LDPC base graph and the extension check sequence of rows comprises the remaining rows of the LDPC base graph.

An example embodiment of a method comprises receiving, at a radio receiver device, a radio signal comprising low-density parity-check, LDPC, encoded information bits. The method further comprises applying, by the radio receiver device, LDPC decoding to the received LDPC encoded information bits to recover the information bits. The applying of the LDPC decoding comprises processing, by the radio receiver device, an LDPC base graph. The processing of the LDPC base graph comprises scheduling, by the radio receiver device, a processing of at least one sequence of rows of the LDPC base graph according to a scheduling state of the at least one sequence of rows, such that transitioning from a current scheduling state of the at least one sequence of rows to a subsequent scheduling state of the at least one sequence of rows occurs according to a state transition metric.

In an example embodiment, alternatively or in addition to the above-described example embodiments, the state transition metric comprises a relationship between a current number of parity check errors and one or more parity check error thresholds, or a relationship between a magnitude of log-likelihood ratios, LLRs, of the information bits and one or more LLR thresholds.

In an example embodiment, alternatively or in addition to the above-described example embodiments, the scheduling states include an extension only, EO, scheduling state in which only an extension check sequence of rows is scheduled. The scheduling states further include an extension and core, EC, scheduling state in which an extension check sequence of rows is scheduled first and a core check sequence of rows is scheduled subsequently. The scheduling states further include an extension and core and core, ECC, scheduling state in which an extension check sequence of rows is scheduled first and a core check sequence of rows is scheduled subsequently twice. The scheduling states further include a core only, CO, scheduling state in which only a core check sequence of rows is scheduled.

In an example embodiment, alternatively or in addition to the above-described example embodiments, the current scheduling state comprises the EO scheduling state and the subsequent scheduling state comprises the EC scheduling state, and the transitioning occurs in response to the current number of the parity check errors falling below a first parity check error threshold.

In an example embodiment, alternatively or in addition to the above-described example embodiments, the current scheduling state comprises the EC scheduling state and the subsequent scheduling state comprises the ECC scheduling state, and the transitioning occurs in response to the current number of the parity check errors exceeding a second parity check error threshold and falling below a third parity check error threshold.

In an example embodiment, alternatively or in addition to the above-described example embodiments, the current scheduling state comprises the EC scheduling state and the subsequent scheduling state comprises the CO scheduling state, and the transitioning occurs in response to the current number of the parity check errors falling below a fourth parity check error threshold.

In an example embodiment, alternatively or in addition to the above-described example embodiments, the current scheduling state comprises the ECC scheduling state and the subsequent scheduling state comprises the CO scheduling state, and the transitioning occurs in response to the number of the current parity check errors falling below a fifth parity check error threshold.

In an example embodiment, alternatively or in addition to the above-described example embodiments, the method further comprises utilizing the EO scheduling state as an initial scheduling state.

In an example embodiment, alternatively or in addition to the above-described example embodiments, the method further comprises terminating the scheduling of the processing in response to the number of the parity check errors for the core check sequence of rows equaling zero.

In an example embodiment, alternatively or in addition to the above-described example embodiments, the core check sequence of rows comprises first four rows of the LDPC base graph and the extension check sequence of rows comprises the remaining rows of the LDPC base graph.

An example embodiment of a computer program comprises instructions for causing a radio receiver device to perform at least the following: receiving a radio signal comprising low-density parity-check, LDPC, encoded information bits; and applying LDPC decoding to the received LDPC encoded information bits to recover the information bits. The applying of the LDPC decoding comprises processing an LDPC base graph. The processing of the LDPC base graph comprises scheduling a processing of at least one sequence of rows of the LDPC base graph according to a scheduling state of the at least one sequence of rows, such that transitioning from a current scheduling state of the at least one sequence of rows to a subsequent scheduling state of the at least one sequence of rows occurs according to a state transition metric.

DESCRIPTION OF THE DRAWINGS

The accompanying drawings, which are included to provide a further understanding of the embodiments and constitute a part of this specification, illustrate embodiments and together with the description help to explain the principles of the embodiments. In the drawings.

Like reference numerals are used to designate like parts in the accompanying drawings.

DETAILED DESCRIPTION

Reference will now be made in detail to embodiments, examples of which are illustrated in the accompanying drawings. The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

Figure 1:
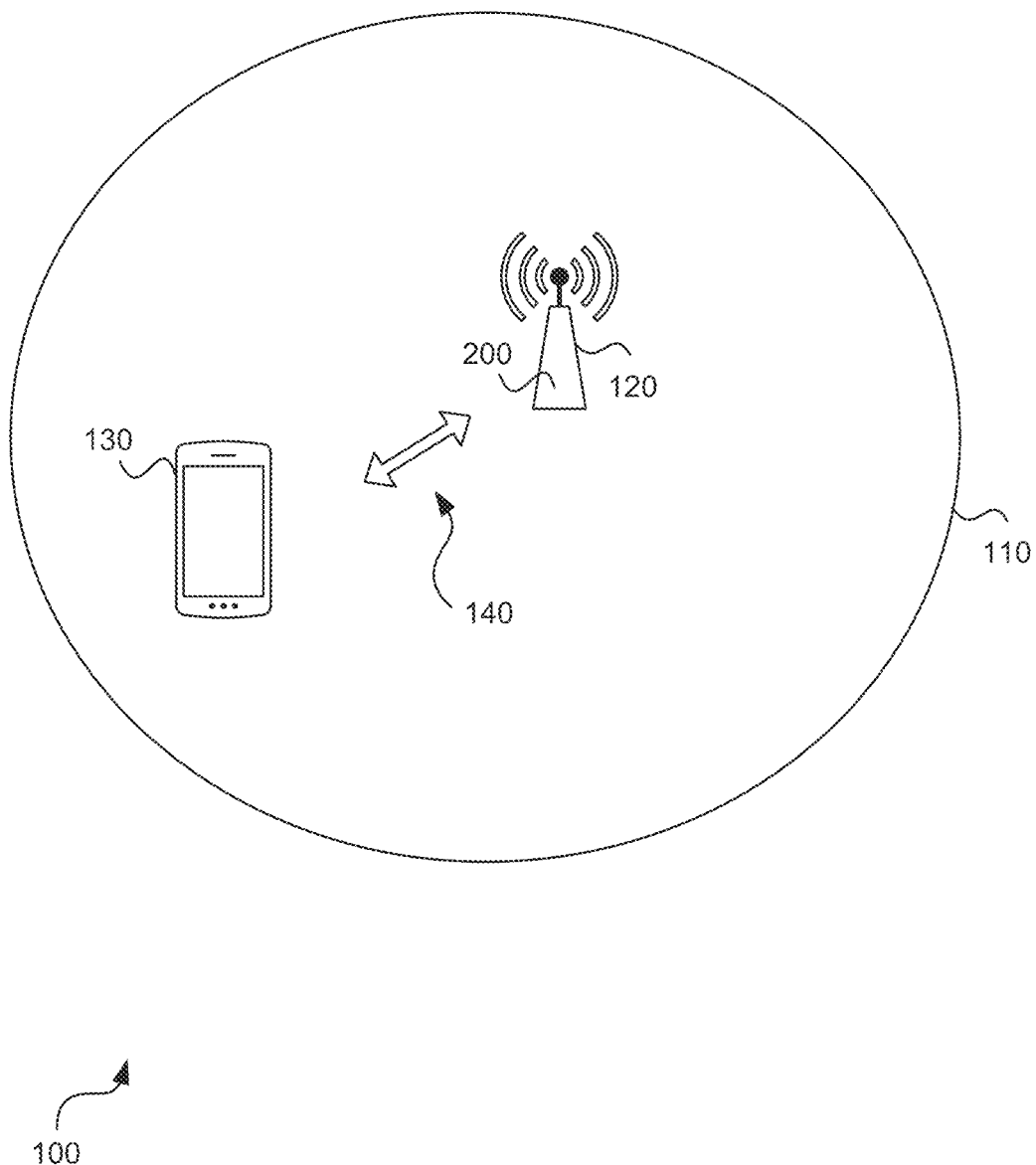
FIG. 1 shows an example embodiment of the subject matter described herein illustrating an example system, where various embodiments of the present disclosure may be implemented.

FIG. 1 illustrates an example system 100, where various embodiments of the present disclosure may be implemented. The system 100 may comprise a fifth generation (5G) new radio (NR) network or a network beyond 5G wireless networks, 110. An example representation of the system 100 is shown depicting a network node device 120, a client device 130, and a radio channel 140. At least in some embodiments, the network 110 may comprise one or more massive machine-to-machine (M2M) network(s), massive machine type communications (mMTC) network(s), internet of things (IoT) network(s), industrial internet-of-things (IIoT) network(s), enhanced mobile broadband (eMBB) network(s), ultra-reliable low-latency communication (URLLC) network(s), and/or the like. In other words, the network 110 may be configured to serve diverse service types and/or use cases, and it may logically be seen as comprising one or more networks.

The client device 130 may include, e.g., a mobile phone, a smartphone, a tablet computer, a smart watch, or any hand-held, portable and/or wearable device. The client device 130 may also be referred to as a user equipment (UE). The network node device 120 may comprise a base station. The base station may include, e.g., any device suitable for providing an air interface for client devices to connect to a wireless network via wireless transmissions. Furthermore, the network node device 120 may comprise a radio receiver device 200 of FIG. 2. Alternatively/additionally, the client device 130 may comprise the radio receiver device 200 (not shown in FIG. 1).

Low-density parity-check (LDPC) may be used for channel coding (encoding and decoding) of user data in the system 100.

The following is a brief overview of using LDPC in 5G. For the transmission of a downlink (DL) transport block, an LDPC base graph may be selected. 5G supports two LDPC base graphs, one for small transport blocks and one for larger transport blocks. Next, the transport block may be segmented into code blocks. Each code block may be individually LDPC encoded. The LDPC coded blocks may then be individually rate matched. Then, code block concatenation may be performed to create a codeword for transmission on a physical downlink shared channel (PDSCH). Up to two code words may be transmitted simultaneously on the PDSCH.

LDPC codes are defined by a sparse parity-check matrix that represents the relationship between data bits and parity bits. 5G specifies two base graphs (Base Graph 1 and Base Graph 2) to construct the parity-check matrix, depending on the transport block size.

The LDPC encoding process takes the segmented code blocks as input and generates parity bits based on chosen base graph and lifting factor. These parity bits may then be appended to the original data bits, forming a codeword that is transmitted over the PDSCH.

In the following, various example embodiments will be discussed. At least some of the example embodiments described herein may allow accelerating LDPC decoding via scheduling.

More specifically, at least some of the example embodiments described herein may allow improving the LDPC decoding by, e.g., scheduling certain sequences of base graph rows when they are most effective. At least in some situations, this may reduce the overall processing needed to converge to a valid code word.

Furthermore, at least some of the example embodiments described herein may allow switching states, i.e., different schedules, as the decoding progresses.

Figure 2:
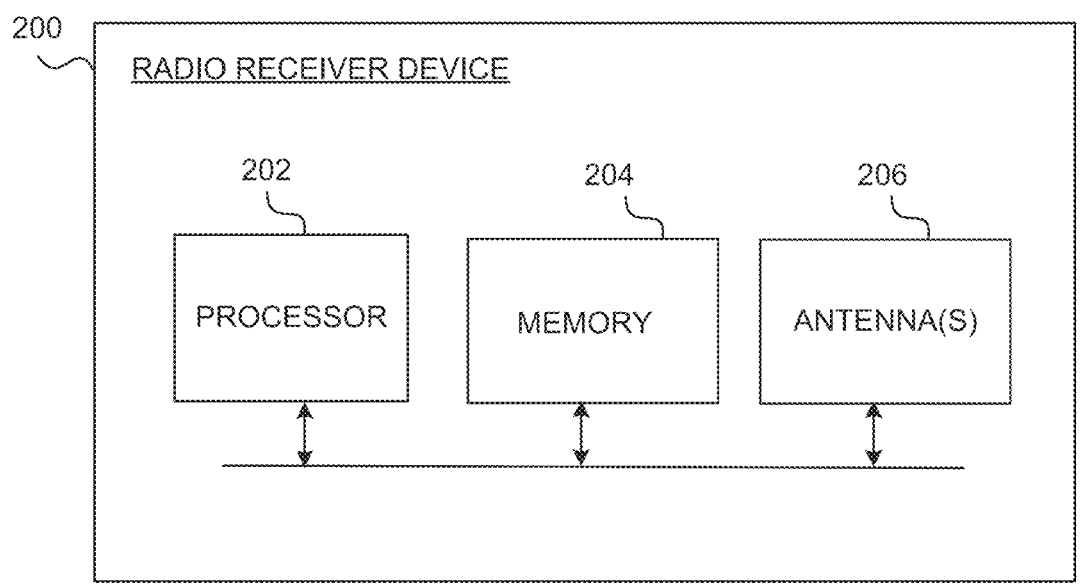
FIG. 2 shows an example embodiment of the subject matter described herein illustrating a radio receiver device.

FIG. 2 is a block diagram of the radio receiver device 200, in accordance with an example embodiment.

The radio receiver device 200 comprises one or more processors 202 and one or more memories 204 that comprise computer program code. The radio receiver device 200 may be configured to receive information from other devices. In one example, the radio receiver device 200 may receive signalling information and data in accordance with at least one cellular communication protocol. The radio receiver device 200 may be configured to provide at least one wireless radio connection, such as for example a 3GPP mobile broadband connection (e.g., 5G or beyond). The radio receiver device 200 may comprise, or be configured to be coupled to, at least one antenna 206 to receive radio frequency signals.

Although the radio receiver device 200 is depicted to include only one processor 202, the radio receiver device 200 may include more processors. In an embodiment, the memory 204 is capable of storing instructions, such as an operating system and/or various applications. Furthermore, the memory 204 may include a storage that may be used to store, e.g., at least some of the information and data used in the disclosed embodiments.

Furthermore, the processor 202 is capable of executing the stored instructions. In an embodiment, the processor 202 may be embodied as a multi-core processor, a single core processor, or a combination of one or more multi-core processors and one or more single core processors. For example, the processor 202 may be embodied as one or more of various processing devices, such as a coprocessor, a microprocessor, a controller, a digital signal processor (DSP), a processing circuitry with or without an accompanying DSP, or various other processing devices including integrated circuits such as, for example, an application specific integrated circuit (ASIC), a field programmable gate array (FPGA), a microcontroller unit (MCU), a hardware accelerator, a special-purpose computer chip, a neural network (NN) chip, an artificial intelligence (AI) accelerator, a tensor processing unit (TPU), a neural processing unit (NPU), or the like. In an embodiment, the processor 202 may be configured to execute hard-coded functionality. In an embodiment, the processor 202 is embodied as an executor of software instructions, wherein the instructions may specifically configure the processor 202 to perform the algorithms and/or operations described herein when the instructions are executed.

The memory 204 may be embodied as one or more volatile memory devices, one or more non-volatile memory devices, and/or a combination of one or more volatile memory devices and non-volatile memory devices. For example, the memory 204 may be embodied as semiconductor memories (such as mask ROM, PROM (programmable ROM), EPROM (erasable PROM), flash ROM, RAM (random access memory), etc.).

The radio receiver device 200 may comprise any of various types of digital devices capable of receiving radio communication in a wireless network. At least in some embodiments, the radio receiver device 200 may be comprised in a base station, such as a fifth-generation or sixth-generation base station or any such device providing an air interface for client devices to connect to the wireless network via wireless transmissions. Alternatively, the radio receiver device 200 may be comprised in a client device, such as a mobile phone, a smartphone, a tablet computer, a smart watch, or any hand-held, portable and/or wearable device.

When executed by the at least one processor 202, instructions stored in the at least one memory 204 cause the radio receiver device 200 at least to perform receiving a radio signal comprising LDPC encoded information bits.

The instructions, when executed by the at least one processor 202, further cause the radio receiver device 200 at least to perform applying LDPC decoding to the received LDPC encoded information bits to recover the information bits.

The applying of the LDPC decoding comprises processing an LDPC base graph. The LDPC base graph may be divided into a core check sequence of rows and an extension check sequence of rows. For example, the core check sequence of rows may comprise first four rows of the LDPC base graph and the extension check sequence of rows may comprise the remaining rows of the LDPC base graph. For example, the LDPC decoding may comprise belief-propagation LDPC decoding.

The processing of the LDPC base graph comprises scheduling a processing of at least one sequence of rows of the LDPC base graph according to a scheduling state of the at least one sequence of rows, such that transitioning from a current scheduling state of the at least one sequence of rows to a subsequent scheduling state of the at least one sequence of rows occurs according to a state transition metric.

Herein, the term "sequence of rows" indicates an ordered set of rows that is constructed from a subset of all rows in the base graph.

For example, the state transition metric may comprise a relationship between a current number of parity check errors and one or more parity check error thresholds, or a relationship between a magnitude of log-likelihood ratios, LLRs, of the information bits and one or more LLR thresholds.

At least in some embodiments, the scheduling states may include an extension only (EO) scheduling state 301 in which only the extension check sequence of rows is scheduled.

The scheduling states may further include an extension and core (EC) scheduling state 302 in which the extension check sequence of rows is scheduled first and the core check sequence of rows is scheduled subsequently.

The scheduling states may further include an extension and core and core (ECC) scheduling state 303 in which the extension check sequence of rows is scheduled first and the core check sequence of rows is scheduled subsequently twice.

The scheduling states may further include a core only (CO) scheduling state 304 in which only the core check sequence of rows is scheduled.

At least in some embodiments, the current scheduling state may comprise the EO scheduling state 301 and the subsequent scheduling state may comprise the EC scheduling state 302, and the transitioning may occur in response to the current number of the parity check errors E falling below a first parity check error threshold $T_1$, as shown in diagram 300 of FIG. 3.

At least in some embodiments, the current scheduling state may comprise the EC scheduling state 302 and the subsequent scheduling state may comprise the ECC scheduling state 303, and the transitioning may occur in response to the current number of the parity check errors E exceeding a second parity check error threshold $T_2$ and falling below a third parity check error threshold $T_3$, as shown in diagram 300 of FIG. 3.

At least in some embodiments, the current scheduling state may comprise the EC scheduling state 302 and the subsequent scheduling state may comprise the CO scheduling state 304, and the transitioning may occur in response to the current number of the parity check errors E falling below a fourth parity check error threshold $T_4$, as shown in diagram 300 of FIG. 3.

At least in some embodiments, the current scheduling state may comprise the ECC scheduling state 303 and the subsequent scheduling state may comprise the CO scheduling state 304, and the transitioning may occur in response to the current number of the parity check errors E falling below a fifth parity check error threshold $T_5$, as shown in diagram 300 of FIG. 3.

At least in some embodiments, the instructions, when executed by the at least one processor 202, may further cause the radio receiver device 200 to perform utilizing the EO scheduling state 301 as an initial scheduling state.

At least in some embodiments, the instructions, when executed by the at least one processor 202, may further cause the radio receiver device 200 to perform terminating the scheduling of the processing in response to, e.g., the number of the parity check errors for the core check sequence of rows equaling zero.

Figure 3:
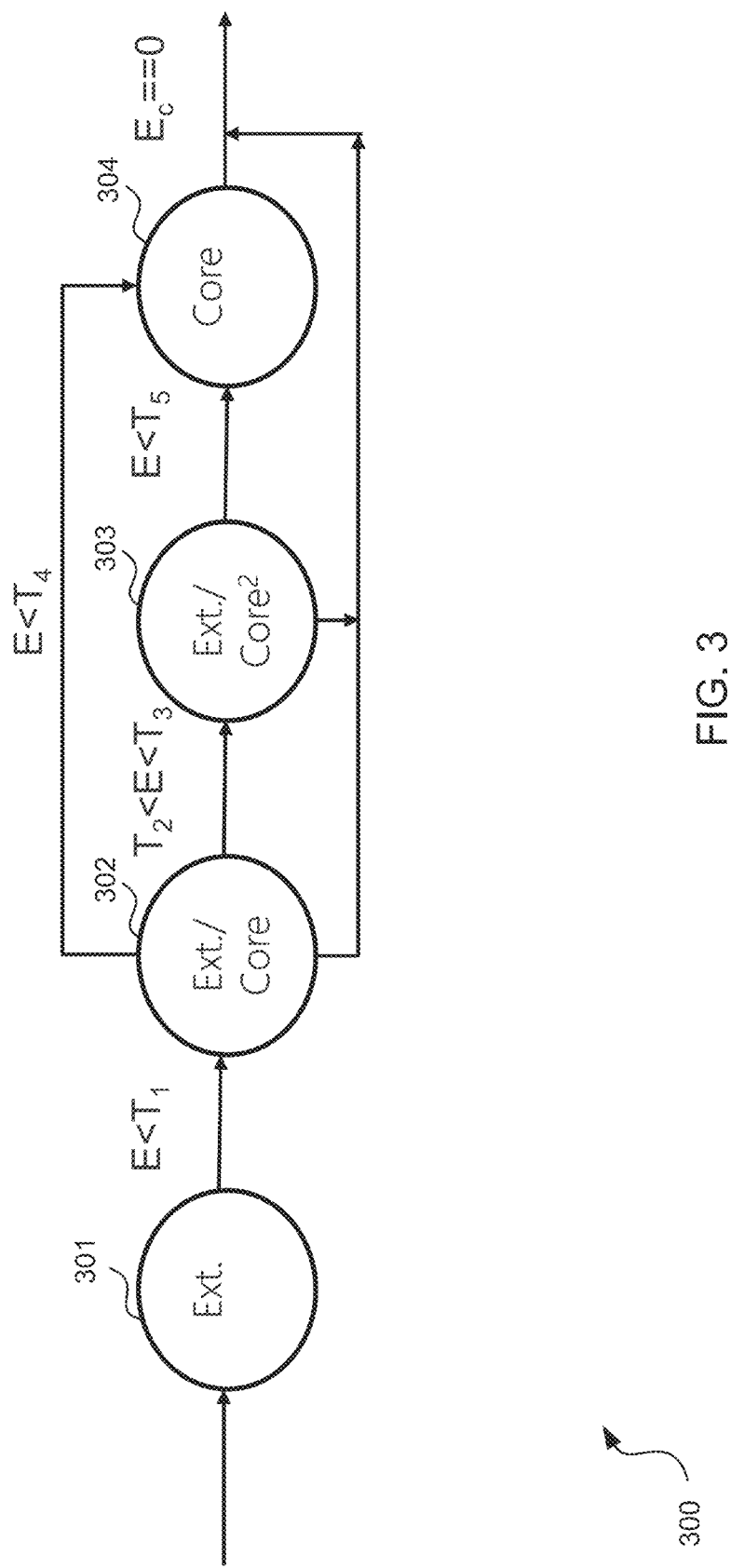
FIG. 3 shows an example embodiment of the subject matter described herein illustrating a state transition diagram.

In other words, at least in some embodiments a subset of the base graph rows may be scheduled according to its state, as illustrated in diagram 300 of FIG. 3. Transitions from state to state may occur according to the number of the parity check errors E and the parity check error thresholds $T_1$-$T_5$. In the EO state 301 only extension rows may be scheduled, while in the ECC state 303 extension rows, core rows, and then core rows again may be scheduled. When all the core parity checks are satisfied, i.e., the number of the parity check errors for the core check sequence of rows ($E_c$)=0, then the decoder may terminate.

At least some embodiments of the disclosed scheduling may reduce the total amount of work done by the decoder because core and extension checks are scheduled when they are most effective in the decoding processes. Extension checks are most effective at a low signal-to-noise ratio (SNR), whereas core checks are useful at a high SNR. Therefore, at least for some embodiments it may be more efficient to start by extension checks and finish with core checks.

Figure 4:
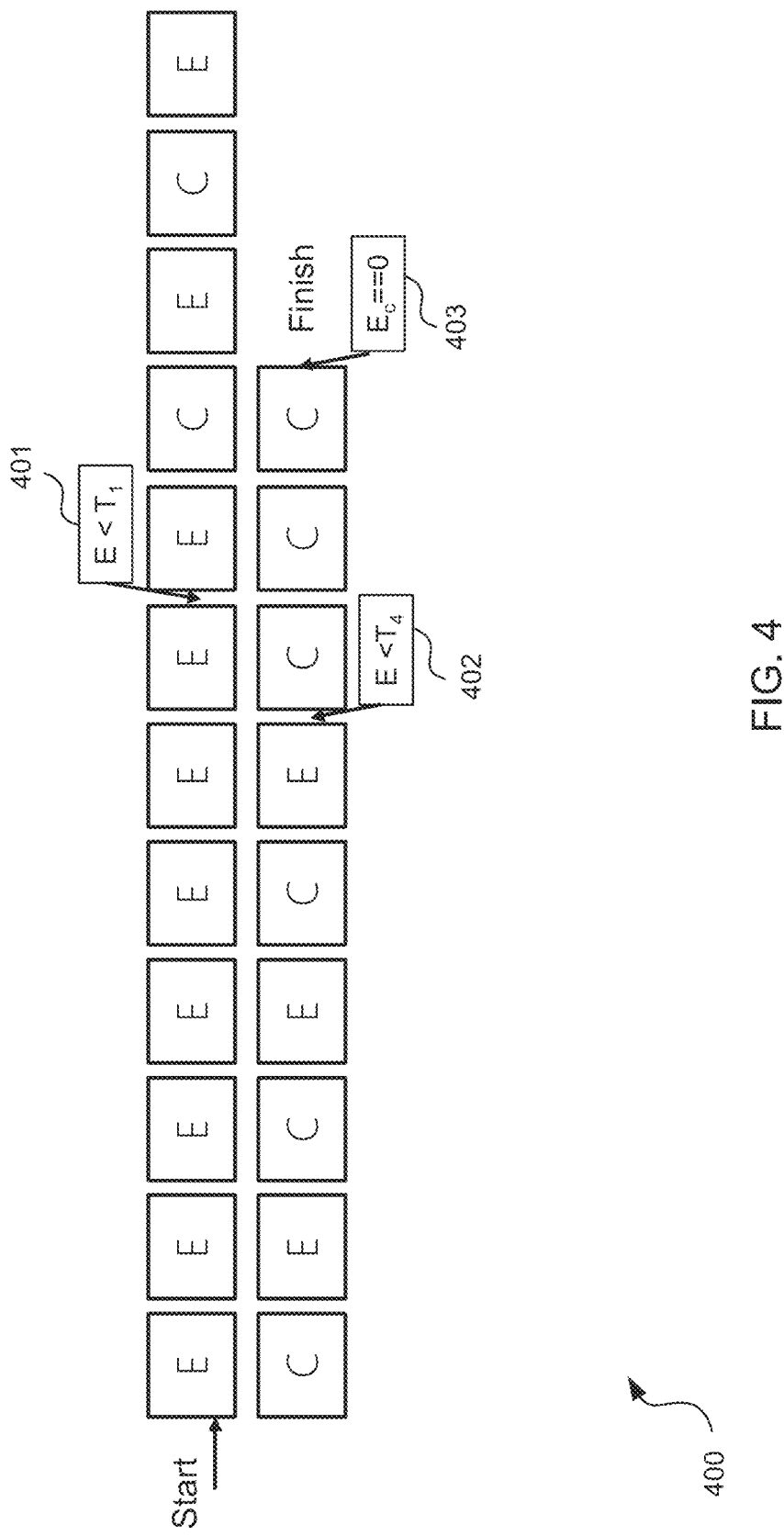
FIG. 4 shows an example embodiment of the subject matter described herein illustrating scheduling for a single codeword.

An example of the disclosed scheduling for a single code word is shown in diagram 400 of FIG. 4 for 3GPP base graph #1, with code rate R=1/3, lifting factor Z=384, and SNR=0 dB.

As discussed above, the EO scheduling state 301 may be utilized as an initial scheduling state resulting in scheduling only the extension check sequence of rows for the first iterations in the example of diagram 400. At point 401, the current number of the parity check errors falls below the first parity check error threshold $T_1$, resulting in transitioning from the EO scheduling state 301 to the EC scheduling state 302, and that results in repeating the scheduling of the extension check sequence of rows first and then the scheduling of the core check sequence of rows for the subsequent iterations in the example of diagram 400. At point 402, the current number of the parity check errors falls below the fourth parity check error threshold $T_4$, resulting in transitioning from the EC scheduling state 302 to the CO scheduling state 304, and that results in scheduling only the core check sequence of rows for the subsequent iterations in the example of diagram 400. At point 403, the number of the parity check errors for the core check sequence of rows $E_c$ falls to zero, resulting in terminating the scheduling.

For the disclosed scheduling 12 equivalent iterations of processing may be used. Equivalent iterations may be computed, e.g., as follows: if processing time of one iteration is EO+CO=1 then for rate R=1/3, CO=0.2 and EO=0.8. The split between CO and EO may be based on measured processing requirements for both sections of the parity check graph.

At least in some embodiments, input LLRs may provide a belief or certainty that a bit is zero or one. Qualitatively, the greater the value the higher the certainty. The LDPC decoding may work by improving the least reliable bit in a parity check equation.

At least in some embodiments, LDPC decoding progress may not be linear. For example, it is possible that an LDPC decoding algorithm may converge to a wrong fixed point, and later start converging to another. Thus, at least in some embodiments, a metric of the decoding progress may be used to determine an optimal scheduling state.

A full state of the LDPC decoding may include all the variable LLRs and messages. At least in some of the disclosed embodiments, information that is on hand, i.e., loaded into memory during the course of normal processing (such as the LLRs and/or parity check bits) may be used instead of the full state. By keeping track of a sum of the magnitudes of the LLRs or the number of parity check errors and the change during each iteration, it is possible to infer if a convergence to a fixed point is occurring. From the point of view of which schedule to choose, e.g., an absolute value of the number of parity errors or the magnitude of the LLRs may be utilized.

At least in some embodiments, the thresholds may vary depending on codeword parameters, such as base graph, code rate and length.

At least in some embodiments, it may be possible to directly jump into an initial state (such as jump into the CO state) based on the magnitudes of the LLRs.

Figure 5:
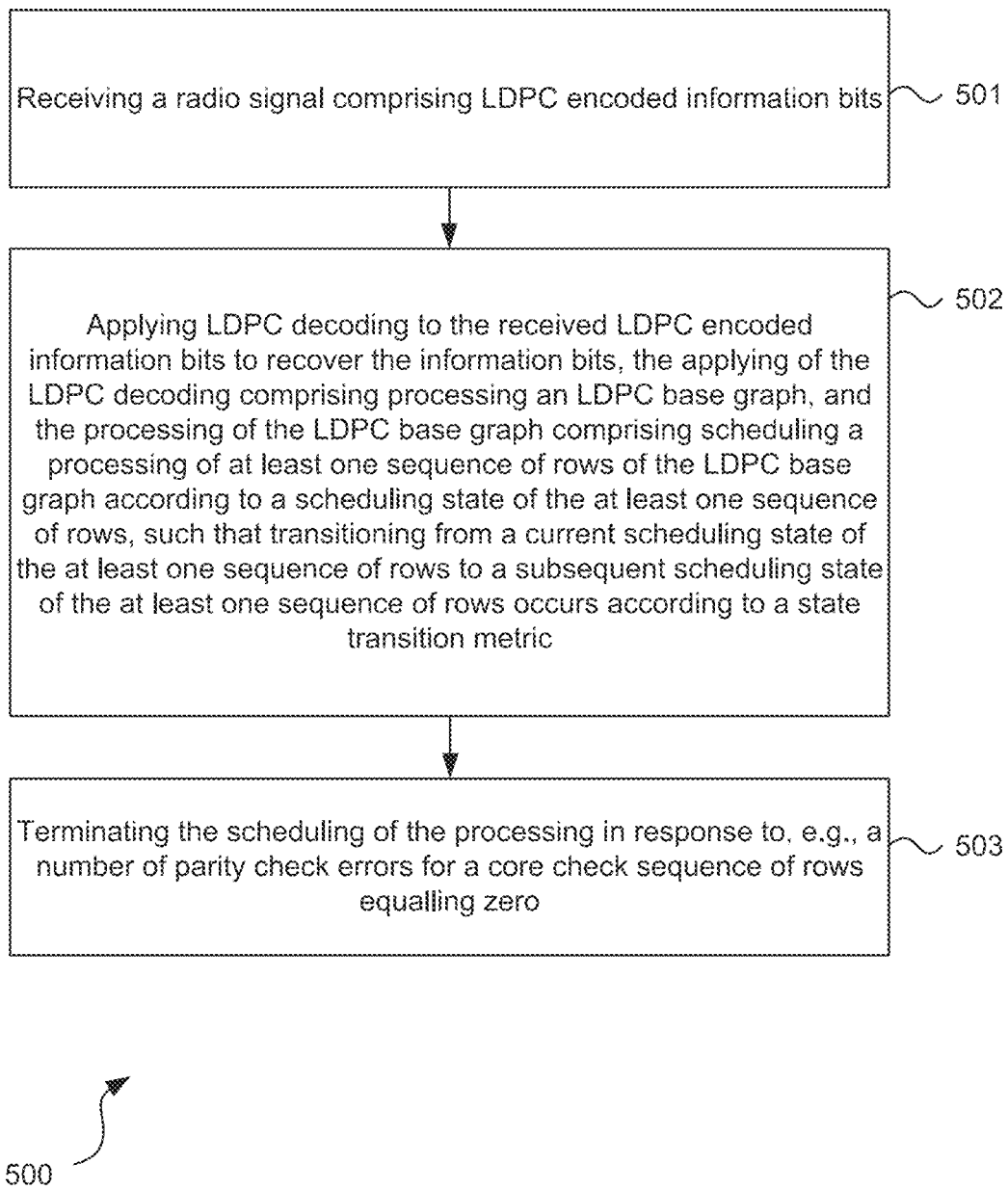
FIG. 5 shows an example embodiment of the subject matter described herein illustrating a method.

FIG. 5 illustrates an example flow chart of a method 500, in accordance with an example embodiment.

At operation 501, the radio receiver device 200 receives the radio signal comprising the LDPC encoded information bits.

At operation 502, the radio receiver device 200 applies the LDPC decoding to the received LDPC encoded information bits to recover the information bits. As discussed above, the applying 502 of the LDPC decoding comprises processing, by the radio receiver device 200, the LDPC base graph. The processing of the LDPC base graph comprises scheduling, by the radio receiver device 200, the processing of at least one sequence of rows of the LDPC base graph according to the scheduling state of the at least one sequence of rows, such that transitioning from the current scheduling state of the at least one sequence of rows to the subsequent scheduling state of the at least one sequence of rows occurs according to the state transition metric.

At optional operation 503, the radio receiver device 200 may terminate the scheduling of the processing in response to, e.g., the number of the parity check errors for the core check sequence of rows equaling zero.

The method 500 may be performed by the radio receiver device 200 of FIG. 2. The operations 501-503 can, for example, be performed by the at least one processor 202 and the at least one memory 204. Further features of the method 500 directly result from the functionalities and parameters of the radio receiver device 200, and thus are not repeated here. The method 500 can be performed by computer program(s).

The radio receiver device 200 may comprise means for performing at least one method described herein. In one example, the means may comprise the at least one processor 202, and the at least one memory 204 storing instructions that, when executed by the at least one processor, cause the radio receiver device 200 to perform the method.

The functionality described herein can be performed, at least in part, by one or more computer program product components such as software components. According to an embodiment, the radio receiver device 200 may comprise a processor or processor circuitry, such as for example a microcontroller, configured by the program code when executed to execute the embodiments of the operations and functionality described. Alternatively, or in addition, the functionality described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), and Graphics Processing Units (GPUs).

Any range or device value given herein may be extended or altered without losing the effect sought. Also, any embodiment may be combined with another embodiment unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item may refer to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the embodiments described above may be combined with aspects of any of the other embodiments described to form further embodiments without losing the effect sought.

The term 'comprising' is used herein to mean including the method, blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. A radio receiver device, comprising:
   at least one processor; and
   at least one memory storing instructions that, when executed by the at least one processor, cause the radio receiver device at least to perform:
   receiving a radio signal comprising low-density parity-check, LDPC, encoded information bits; and applying LDPC decoding to the received LDPC encoded information bits to recover the information bits, the applying of the LDPC decoding comprising processing an LDPC base graph, wherein the processing of the LDPC base graph comprises scheduling a processing of at least one sequence of rows of the LDPC base graph according to a scheduling state of the at least one sequence of rows, such that transitioning from a current scheduling state of the at least one sequence of rows to a subsequent scheduling state of the at least one sequence of rows occurs according to a state transition metric.

2. The radio receiver device according to claim 1, wherein the state transition metric comprises a relationship between a current number of parity check errors and one or more parity check error thresholds, or a relationship between a magnitude of log-likelihood ratios, LLRs, of the information bits and one or more LLR thresholds.

3. The radio receiver device according to claim 2, wherein the scheduling states include:
- an extension only, EO, scheduling state in which only an extension check sequence of rows is scheduled;
- an extension and core, EC, scheduling state in which an extension check sequence of rows is scheduled first and a core check sequence of rows is scheduled subsequently;
- an extension and core and core, ECC, scheduling state in which an extension check sequence of rows is scheduled first and a core check sequence of rows is scheduled subsequently twice; and
- a core only, CO, scheduling state in which only a core check sequence of rows is scheduled.

4. The radio receiver device according to claim 3, wherein the current scheduling state comprises the EO scheduling state and the subsequent scheduling state comprises the EC scheduling state, and the transitioning occurs in response to the current number of the parity check errors falling below a first parity check error threshold.

5. The radio receiver device according to claim 3, wherein the current scheduling state comprises the EC scheduling state and the subsequent scheduling state comprises the ECC scheduling state, and the transitioning occurs in response to the current number of the parity check errors exceeding a second parity check error threshold and falling below a third parity check error threshold.

6. The radio receiver device according to claim 3, wherein the current scheduling state comprises the EC scheduling state and the subsequent scheduling state comprises the CO scheduling state, and the transitioning occurs in response to the current number of the parity check errors falling below a fourth parity check error threshold.

7. The radio receiver device according to claim 3, wherein the current scheduling state comprises the ECC scheduling state and the subsequent scheduling state comprises the CO scheduling state, and the transitioning occurs in response to the current number of the parity check errors falling below a fifth parity check error threshold.

8. The radio receiver device according to claim 3, wherein the instructions, when executed by the at least one processor, further cause the radio receiver device to perform utilizing the EO scheduling state as an initial scheduling state.

9. The radio receiver device according to claim 4, wherein the instructions, when executed by the at least one processor, further cause the radio receiver device to perform terminating the scheduling of the processing in response to the number of the parity check errors for the core check sequence of rows equaling zero.

10. The radio receiver device according to claim 3, wherein the core check sequence of rows comprises first four rows of the LDPC base graph and the extension check sequence of rows comprises the remaining rows of the LDPC base graph.

11. A method, comprising:
receiving, at a radio receiver device, a radio signal comprising low-density parity-check, LDPC, encoded information bits; and
applying, by the radio receiver device, LDPC decoding to the received LDPC encoded information bits to recover the information bits, the applying of the LDPC decoding comprising processing, by the radio receiver device, an LDPC base graph,
wherein the processing of the LDPC base graph comprises scheduling, by the radio receiver device, a processing of at least one sequence of rows of the LDPC base graph according to a scheduling state of the at least one sequence of rows, such that transitioning from a current scheduling state of the at least one sequence of rows to a subsequent scheduling state of the at least one sequence of rows occurs according to a state transition metric.

12. A computer program comprising instructions for causing a radio receiver device to perform at least the following:
receiving a radio signal comprising low-density parity-check, LDPC, encoded information bits; and
applying LDPC decoding to the received LDPC encoded information bits to recover the information bits, the applying of the LDPC decoding comprising processing an LDPC base graph,
wherein the processing of the LDPC base graph comprises scheduling a processing of at least one sequence of rows of the LDPC base graph according to a scheduling state of the at least one sequence of rows, such that transitioning from a current scheduling state of the at least one sequence of rows to a subsequent scheduling state of the at least one sequence of rows occurs according to a state transition metric.

* * * * *